United States Patent
Kusumi et al.

[11] Patent Number: 6,022,810
[45] Date of Patent: Feb. 8, 2000

[54] METHOD OF MANUFACTURING SEMICONDUCTOR DEVICE

[75] Inventors: Yoshihiro Kusumi; Takahiro Yokoi; Satoshi Iida, all of Hyogo, Japan

[73] Assignee: Mitsubishi Denki Kabushiki Kaisha, Tokyo, Japan

[21] Appl. No.: 09/058,413

[22] Filed: Apr. 10, 1998

[30] Foreign Application Priority Data

Nov. 6, 1997 [JP] Japan .................................. 9-304052

[51] Int. Cl.$^7$ .................................................. H01L 21/311
[52] U.S. Cl. .......................... 438/738; 438/740; 438/743; 438/744
[58] Field of Search .................... 438/668, 694, 438/695, 720, 723, 738, 742, 743, 397, 740, 744

[56] References Cited

U.S. PATENT DOCUMENTS

| | | | |
|---|---|---|---|
| 5,306,952 | 4/1994 | Matsuura et al. | 257/765 |
| 5,319,246 | 6/1994 | Nagamine et al. | 257/758 |
| 5,328,553 | 7/1994 | Poon | 438/633 |
| 5,362,358 | 11/1994 | Yamagata et al. | 156/345 |
| 5,429,710 | 7/1995 | Akiba et al. | 438/714 |
| 5,485,091 | 1/1996 | Verkuil | 324/455 |
| 5,514,615 | 5/1996 | Ema et al. | 438/152 |
| 5,672,534 | 9/1997 | Huang | 438/254 |
| 5,879,956 | 3/1999 | Seon et al. | 438/3 |
| 5,900,644 | 5/1999 | Ying et al. | 257/48 |

FOREIGN PATENT DOCUMENTS 7-321204  12/1995  Japan .

*Primary Examiner*—Benjamin Utech
*Assistant Examiner*—Donald L. Champagne
*Attorney, Agent, or Firm*—McDermott, Will & Emery

[57] ABSTRACT

An interconnection layer 3 in a floating state and an interlayer insulating film 6 are formed on a semiconductor substrate. A connection hole 4 penetrating the interlayer insulating film and the interconnection layer is formed by dry etching with fluorocarbon. Filled in the connection hole is a conductive member 5 which is electrically connected to the interconnection layer. Accordingly, an improved method for manufacturing a semiconductor device offering a reduced contact resistance even for an extremely small contact hole is obtained.

5 Claims, 7 Drawing Sheets

METHOD OF MANUFACTURING SEMICONDUCTOR DEVICE

BACKGROUND OF THE INVENTION

1 Field of the Invention

The present invention relates generally to a method of manufacturing a semiconductor device, and more particularly to a method of manufacturing a semiconductor device by taking advantage of the presence/absence of an electrical conduction between an underlying interconnection pattern of a contact hole and a substrate. The present invention also relates to a method of manufacturing a semiconductor device by taking advantage of the fact that there is a difference in etch selectivity between an oxide film and an underlying interconnection pattern thereunder according to the area of the underlying interconnection pattern.

2 Description of the Background Art

A method of manufacturing a conventional semiconductor device, such as a fuse element, will be described with reference to FIG. 13.

Referring to FIG. 13, a lower interlayer insulating film 1 is formed on a semiconductor substrate 100. An interconnection layer 3 is formed on lower interlayer insulating film 1. An upper interlayer insulating film 6 is formed on lower interlayer insulating film 1 to cover interconnection layer 3. Formed in upper interlayer insulating film 6 is a contact hole 4 reaching interconnection layer 3. Contact hole 4 is formed so that etching will stop at the top surface of interconnection layer 3. A plug 5, which is to be a conductive member, is filled in contact hole 4. Upper interconnection layers 7a, 7b, connected to respective plugs 5, are formed on upper interlayer insulating film 6. Although not shown, upper interconnection layer 7a is connected to a first circuit, upper interconnection layer 7b to a second circuit. The first circuit and the second circuit are electrically isolated from each other by cutting off interconnection layer 3 therebetween.

In the semiconductor device, interconnection layer 3 is electrically conducted to upper interconnection layers 7a, 7b, respectively, via plug 5. In such a structure, the smaller the radius of contact hole 4 becomes, the smaller the contact area between interconnection layer 3 and plug 5 will be, which leads to an increased contact resistance.

Now, a method of manufacturing a conventional semiconductor device, such as a dynamic random access memory, will be described.

Referring to FIG. 14, an interlayer insulating film 1a is formed on a semiconductor substrate 100. A lower interconnection layer 10 is formed on interlayer insulating film 1a. An interlayer insulating film 1b is formed on interlayer insulating film 1a to cover lower interconnection layer 10. By photolithography and etching, in interlayer insulating films 1a and 1b, a first connection hole 11 is formed to reach semiconductor substrate 100. A photoresist, which was used as a mask in the photolithography, is then removed. Formed on interlayer insulating film 1b is a first storage node electrode 12 electrically connected to semiconductor substrate 100 through first connection hole 11. To form first storage node electrode 12, a polycrystalline silicon film is first formed on semiconductor substrate 100, which is then patterned by photolithography and dry etching. A photoresist used as a mask is then removed. An interlayer insulating film 1c is formed on interlayer insulating film 1b to cover first storage node electrode 12. Utilizing the photolithography and etching again, a second connection hole 14a is formed to make an electrical conduction between first storage node electrode 12 and a second storage node electrode as described below.

Referring to FIG. 15, a polycrystalline silicon film is formed for the formation of second storage node electrode 13a, which is subjected to photolithography and then patterned by dry etching in the manner as described above. The photoresist used as a mask is now removed. An interlayer insulating film 1d is formed on interlayer insulating film 1c to cover second storage node electrode 13a. By photolithography and etching, a second connection hole 14b is formed to achieve an electrical conduction between second storage node electrode 13a and a third storage node electrode as described below.

Referring to FIGS. 15 and 16, another polycrystalline silicon film is formed, subjected to photolithography, and patterned by dry etching in the manner as described above to form the third storage node electrode 13b.

FIG. 17 is a cross sectional view of a conventional static random access memory, which will be described later.

In the conventional method of manufacturing a dynamic random access memory, the following series of steps are repeated for each fin: forming an interlayer insulating film; performing photolithography; etching to form a connection hole; forming a polycrystalline silicon film; performing photolithography; and etching to form a storage node electrode. Thus a large number of process steps are required. This results in poor efficiency in manufacturing, and thus decreases the yield of the device.

In the conventional method of manufacturing a semiconductor device, besides the problem regarding manufacturing methods of the aforementioned fuse element, dynamic random access memory (DRAM) and static random access memory (SRAM), there is another problem in measuring thickness of a gate oxide film. The thickness of a gate oxide film or the like has been conventionally measured using an optical measuring device such as an ellipsometer. With the increasing demand for a thinner gate film, however, it has been found that such an optical measuring device cannot provide a reliable measurement value for a film less than 3 nm thick. There has been another way of accurately measuring the thickness of a thin oxide film, which is to examine the cross section of the film by a transmission electron microscope (TEM). This, however, takes a relatively long time for examining a single point, and is therefore not effective when there exist a number of measuring points such as the case where the distribution of film thickness in a wafer surface is to be examined.

SUMMARY OF THE INVENTION

Accordingly, an object of the present invention is to provide a method of manufacturing a semiconductor device by taking advantage of the fact that etch selectivity between an oxide film and an underlying interconnection pattern thereunder varies according to the presence/absence of an electrical conduction between the underlying interconnection pattern of a contact hole and a substrate.

Another object of the present invention is to provide a method of manufacturing an improved semiconductor device which suppresses the increase of contact resistance in a contact hole with a small hole radius by taking advantage of the fact that the etch selectivity between the oxide film and the underlying interconnection pattern varies according to the size of the underlying interconnection pattern area when there is no electrical conduction between the underlying interconnection pattern and the substrate.

A still another object of the present invention is to provide a method of manufacturing a semiconductor device restricting the increase in contact resistance by taking advantage of the fact that the etch selectivity between the oxide film and the underlying interconnection pattern varies according to the underlying interconnection pattern area when there is no electrical conduction between the underlying interconnection pattern and the substrate.

A further object of the present invention is to provide a method of manufacturing a semiconductor device allowing a substantial reduction in the number of process steps.

A still further object of the present invention is to provide a method of manufacturing an improved semiconductor device permitting an accurate measurement of the distribution of the thickness of a thin oxide film, by taking advantage of the fact that the etch selectivity between the oxide film and the underlying interconnection pattern varies according to the underlying interconnection pattern area when there is no electrical conduction between the underlying interconnection pattern and the substrate.

In the method of manufacturing a semiconductor device according to a first aspect of the present invention, an interconnection layer in a floating state is first formed on a semiconductor substrate. To cover the interconnection layer, an interlayer insulating film is formed on the semiconductor substrate. By dry etching employing fluorocarbon, a connection hole is formed to penetrate the interlayer insulating film and the interconnection layer. Filled in the connection hole is a conductive member electrically connected to the interconnection layer.

According to this aspect of the invention, a large contact area between the conductive member and the interconnection layer is obtained since the conductive member is filled in the connection hole formed in the interconnection layer.

According to a second aspect of the present invention, dry etching is effected by electron cyclotron resonance.

According to a third aspect of the present invention, the sidewall area of the interconnection layer exposed by the connection hole is made larger than the bottom area of the connection hole. Accordingly, the present invention is very effective with an extremely small contact hole, providing a good electrical connection between the interconnection layer and the conductive member.

A fourth aspect of the present invention is directed to a method of manufacturing a semiconductor device including a fin type capacitor having a first electrode and a second electrode provided on the first electrode. The first electrode is initially formed on a semiconductor substrate, which is electrically connected to the semiconductor substrate. An interlayer insulating film is formed on the semiconductor substrate to cover the first electrode. The second electrode in a floating state is formed on the interlayer insulating film. A connection hole is formed by dry etching using fluorocarbon, which penetrates the second electrode and the interlayer insulating film to reach the first electrode. The first electrode and the second electrode are electrically connected to each other by a conductive member filled in the connection hole.

According to this aspect of the invention, a manufacturing process can be simplified as the connection hole penetrating the second electrode and the interlayer insulating film and reaching the first electrode is formed in a single step.

A fifth aspect of the present invention is directed to a method of manufacturing a semiconductor device including a static random access memory. A gate electrode is first formed on a semiconductor substrate. To cover the gate electrode, a first interlayer insulating film is formed on the semiconductor substrate. Formed on the first interlayer insulating film is a thin film transistor (TFT, hereinafter) electrode in a floating state. A second interlayer insulating film is formed on the first interlayer insulating film to cover the TFT electrode. By dry etching using fluorocarbon, a connection hole is formed, which penetrates the second interlayer insulating film, the TFT electrode and the first interlayer insulating film, and reaches the gate electrode. A conductive member is filled in the connection hole to electrically connect the gate electrode to the TFT electrode. On the second interlayer insulating film, an upper interconnection layer is formed, which is electrically connected to the conductive member.

According to this aspect of the invention, a connection hole penetrating the second interlayer insulating film, the TFT electrode and the first interlayer insulating film to reach the gate electrode is formed in a single step, so that a fabrication process is simplified.

According to a sixth aspect of the present invention, an insulating film is initially formed on a substrate. Formed on the insulating film are a plurality of polysilicon films with different surface areas, each in a floating state. An interlayer insulating film is formed on the semiconductor substrate to cover the polysilicon films. On the interlayer insulating film, a resist pattern is formed, which has a plurality of openings in order to form a plurality of connection holes in the interlayer insulating film to be reached respectively to the plurality of polysilicon films. Using the resist pattern as a mask, dry etching employing fluorocarbon is conducted for a prescribed time period to form the plurality of connection holes penetrating the interlayer insulating film. A conductive member is filled in each of the plurality of connection holes. Among the polysilicon patterns which ensure an electrical conduction with the semiconductor substrate and the conductive member, a first polysilicon pattern having the largest area is found. Similarly, among the polysilicon patterns which have no electrical conduction with the semiconductor substrate or the conductive member, a second polysilicon pattern having the smallest area is found. The thickness of the insulating film is then obtained from the areas of the first polysilicon pattern and the second polysilicon pattern.

According to this aspect of the invention, the thickness of the insulating film is obtained by simply finding the first polysilicon pattern area and the second polysilicon pattern area. Accordingly, it takes only a short time to reliably determine the distribution of thickness of an oxide film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention will be described with reference to the drawings.

First Embodiment

Figure 1A:
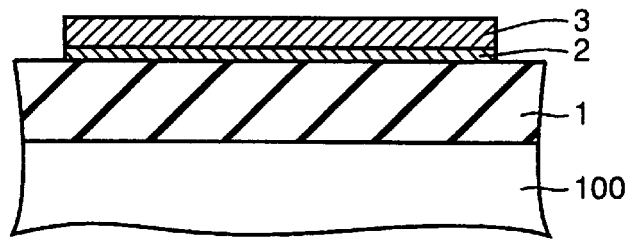
FIGS. 1A, 1B, 1C and 1D are cross sectional views showing a semiconductor device at respective steps of a method of manufacturing a semiconductor device according to a first embodiment of the present invention.

With reference to FIGS. 1A to 1D, a method of manufacturing a semiconductor device, such as a fuse element, according to the first embodiment will be described. Referring to FIG. 1A, a lower interlayer insulating film 1 is formed on a semiconductor substrate 100. On lower interlayer insulating film 1, a stopper film 2 is formed. Stopper film 2 may be formed of any material, whether conductive or non-conductive, as long as it is different from that for an interconnection layer 3. Preferably, stopper film 2 is an LP (low pressure)-$Si_3N_4$ film, for example. Formed after the formation of stopper film 2 is an interconnection layer 3, which may be made of any conductive material. Interconnection layer 3 can be a single layer film or a multi-layer film, formed, for example, of doped polysilicon. The process of formation of interconnection layer 3 is as follows: although not shown, a polysilicon layer is formed on stopper film 2; on the polysilicon layer, a resist mask having a pattern for interconnection layer 3 is formed by photolithography; and then, using the resist mask, the polysilicon layer is etched by a dry etching device to form interconnection layer 3.

Figure 1B:
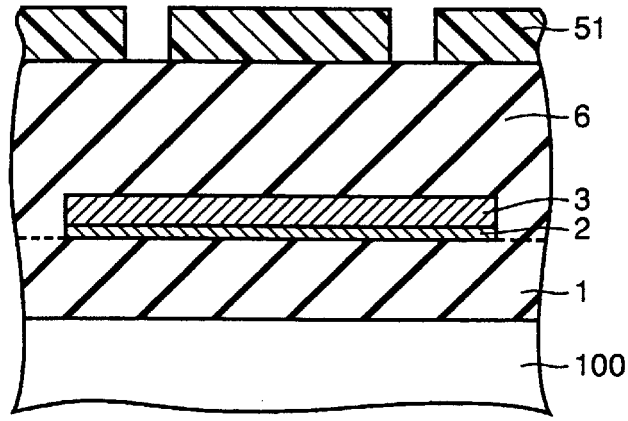
Figure 1C:
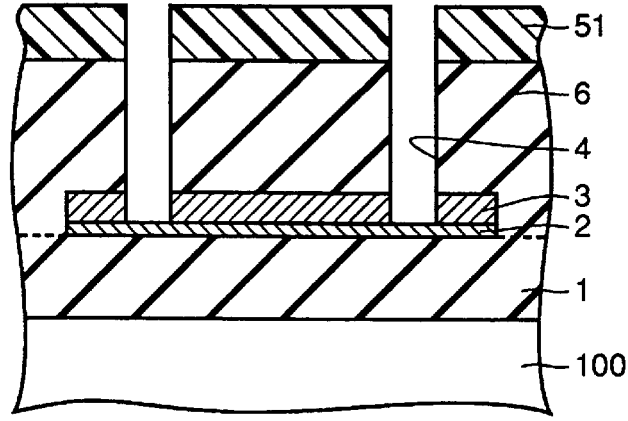

Referring to FIG. 1B, an upper interlayer insulating film 6 is formed on lower interlayer insulating film 1 to cover interconnection layer 3. On upper interlayer insulating film 6, a resist pattern 51 is formed by photolithography, which has an opening at a portion where a contact hole, or a connection hole, is to be formed. Referring to FIG. 1C, using resist pattern 51, a contact hole 4 is formed by dry etching employing $C_4F_8/O_2$ gas. Etching is conducted by an electron cyclotron resonance (ECR) plasma type dry etching device. At this time, if interconnection layer 3 is in a floating state, the etch selectivity between the oxide film (upper interlayer insulating film) and the underlying polysilicon (interconnection layer 3) is lowered, and thus contact hole 4 penetrates interconnection layer 3 with no need of excessive over etching and the etching stops at stopper film 2. In this etching condition, the etch selectivity, which is 20 when interconnection layer 3 is not in a floating state, is lowered to 2 or 3 by making it floating. Resist mask 51 is then removed. The reason of the lowering of the etch selectivity will be described later.

Figure 1D:
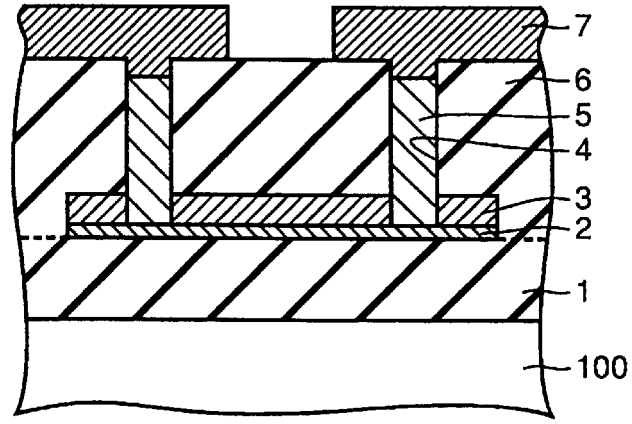

Referring to FIG. 1D, a conductive member or a plug 5, is filled in contact hole 4. An upper interconnection layer 7 is formed to be electrically connected to plug 5. Plug 5 is made, for example, of W; upper interconnection layer 7, for example, AlCu. Since contact hole 4 penetrates interconnection layer 3, the sidewall of interconnection layer 3 exposed by contact hole 4 has contact with plug 5. In this case, the contact area becomes larger than where only the bottom of the hole has contact. Therefore, according to this embodiment, lower contact resistance can be obtained even for a contact hole with an extremely small radius.

Figure 2:
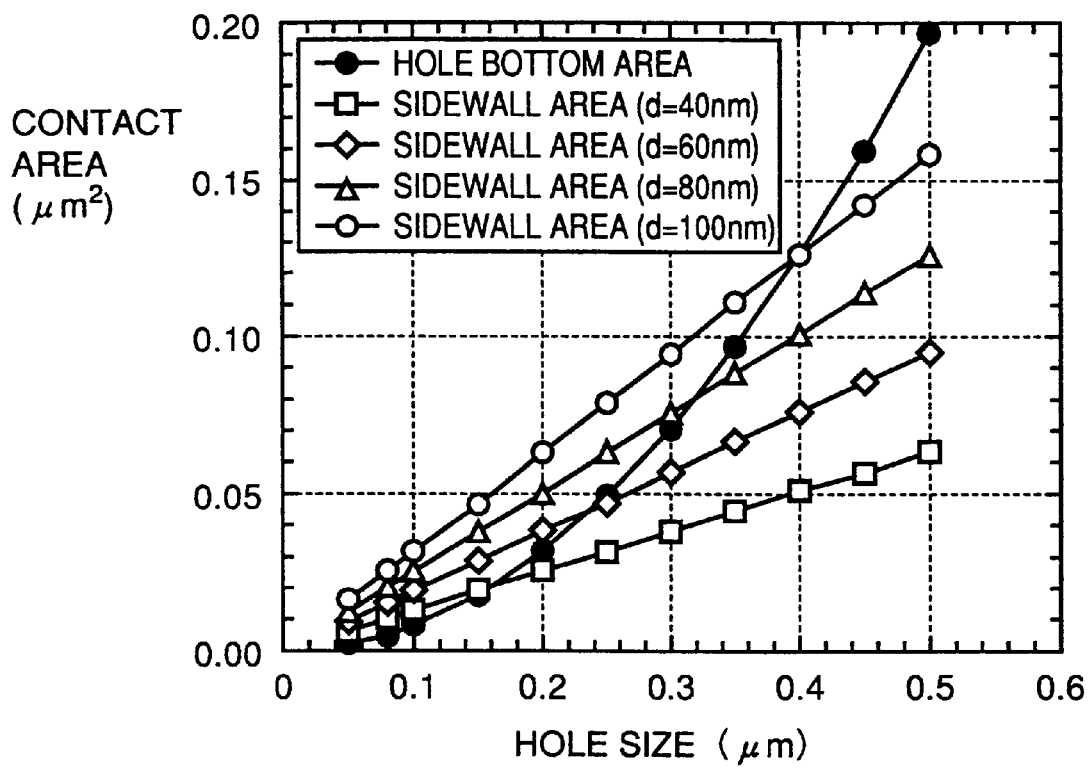
FIG. 2 is a graph showing a relation between the hole size and the contact area of the semiconductor device obtained according to the first embodiment of the present invention.

FIG. 2 is a graph showing a relation between the hole size, or the diameter of the contact hole, and the contact area. In this graph, the hole bottom area means the area of the bottom of the contact hole; and the sidewall area, the area of the sidewall of the interconnection layer exposed by the contact hole. The letter "d" in the graph represents the thickness of interconnection layer 3.

Referring to FIG. 2, as the hole size is made increasingly small, the sidewall area exceeds the hole bottom area at a certain point. The present invention is effective when a contact is made with a hole whose sidewall area is larger than the hole bottom area.

It should be understood that, although stopper film 2 is formed in this embodiment, it is not intended to limit the present invention. Stopper film 2 is required only when there is a possibility of short circuit between the interconnection layer and the underlayer.

Furthermore, $C_4F_8/O_2$ is used as etching gas for the formation of contact hole 4 in this embodiment; however, any gas including fluorocarbon may be used besides $C_4F_8$.

Second Embodiment

The second embodiment of the present invention is directed to a method of forming a storage node electrode having three fins in a dynamic random access memory.

Figure 3:
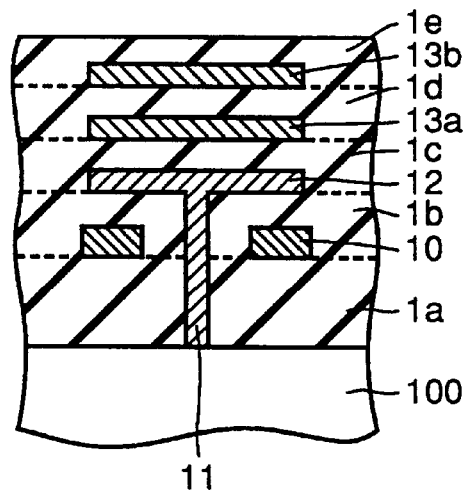
FIGS. 3, 4 and 5 are cross sectional views of a semiconductor device at first to third steps of a method of manufacturing a semiconductor device according to a second embodiment of the present invention.

Referring to FIG. 3, an interlayer insulating film 1a is formed on a semiconductor substrate 100. On interlayer insulating film 1a, a lower interconnection layer 10 (e.g., a W polycide interconnection layer) is formed. An interlayer insulating film 1b (a BPTEOS oxide film) is then formed on lower interconnection layer 10. Formed on interlayer insulating film 1b by photolithography is a resist pattern (not shown) having an opening in which portion a first connection hole 11 is to be formed. Using the resist pattern as a mask, interlayer insulating films 1a, 1b are etched by dry etching employing $C_4F_8/O_2$ gas-plasma to form the first connection hole 11. Here, an ECR type or ICP (inductively coupled plasma) type etching device is used, which can generate plasma with high density. However, a parallel plate type etching device generating a low density of plasma may be used alternatively. The photoresist which was used as a mask is now removed. Next, on interlayer insulating film 1b, a polycrystalline silicon film (not shown) is formed to be electrically connected to semiconductor substrate 100 via first connection hole 11. This polycrystalline silicon film is patterned by photolithography and dry etching employing $Cl_2/O_2$ gas-plasma, to form a first storage node electrode 12. An interlayer insulating film (e.g., a BPTEOS oxide film) 1c is formed on first storage node electrode 12. Formed on interlayer insulating film 1c is a second storage node electrode 13a electrically isolated from semiconductor substrate 100. Second storage node electrode 13a is formed by photolithography and dry etching of a polycrystalline silicon film (not shown) formed on interlayer insulating film 1c. An interlayer insulating film (e.g., a BPTEOS oxide film) 1d is formed on second storage node electrode 13a. Formed on interlayer insulating film 1d is a third storage node electrode 13b electrically isolated from the semiconductor substrate. Third storage node electrode 13b is formed by photolithography and dry etching of a polycrystalline silicon film (not shown) formed on interlayer insulating film 1d. For the etching of the polycrystalline silicon films, the same device as used for etching the BPTEOS oxide film as described above may be used. A method of generating plasma or the order of the density of plasma to be generated is not critical to the invention. An interlayer insulating film 1e (a BPTEOS oxide film) is then formed on third storage node electrode 13b.

Figure 4:
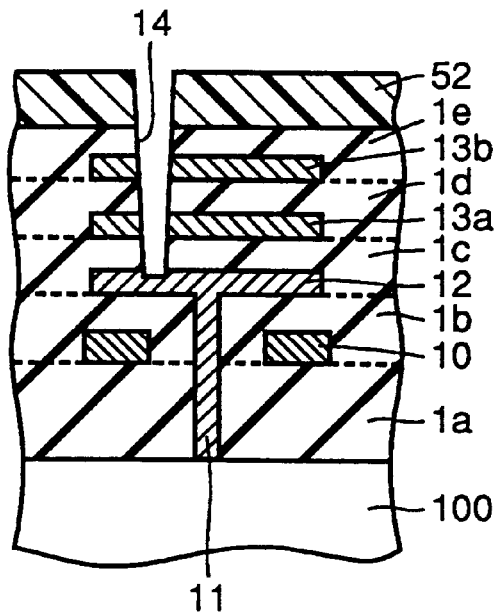

Referring to FIG. 4, a resist pattern 52 is formed, which has an opening under which a second connection hole 14 is to be formed. Using resist pattern 52 as a mask, second connection hole 14 is formed by dry etching employing $C_4F_8/O_2$ gas-plasma, which penetrates interlayer insulating film 1e, third storage node electrode 13b, interlayer insulating film 1d, second storage node electrode 13a, and interlayer insulating film 1c. Thereafter, resist pattern 52 is removed.

Now, the reason why the second connection hole 14 can be formed in a single step will be described.

When etching a hole, the etch selectivity of an object to be etched to its underlayer generally depends on the thickness of a reaction product (generally a fluorocarbon film) generated on the bottom of the hole, or its amount generated. The formation reaction (polymerization reaction) of the fluorocarbon film is not just a pure chemical reaction; energy by ion bombardment also is a contributor. Referring to FIG. 4, once etching reaches third storage node electrode 13b which is electrically isolated from semiconductor substrate 100, positive ions generated in plasma gradually charge up into third storage node electrode 13b, which results in the increase in the repulsive force in third storage node electrode 13b against subsequently incoming positive ions, and therefore the decrease in ion flux, or the amount or density of ions coming into the contact hole. As a result, a generated amount of the fluorocarbon film decreases, and thus the etch selectivity between interlayer insulating film 1e and third storage node electrode 13b is lowered. This etch selectivity is 2 to 3 when the underlayer (13b) is in a floating state; otherwise, it would be 20.

When the etching reaches first storage node electrode 12 which is electrically conductive to semiconductor substrate 100, the incoming ions go out to semiconductor substrate 100, not charging up into first storage node electrode 12. As a result, with no reduction in ion flux, fluorocarbon is generated at the bottom of the contact hole sufficiently enough to keep a large etch selectivity between the object to be etched and its underlayer. Therefore, as shown in FIG. 4, first connection hole 14 reaching first storage node electrode 12 can be formed in a single step.

As described above, under the same etching condition, the etch selectivity between an object to be etched and its underlayer can be made small for a pattern in a floating state, whereas it can be made large for a pattern which is electrically conductive to a semiconductor substrate. The second embodiment takes advantage of this phenomenon. For this etching, a device which can generate plasma in a high density, such as an ECR type or ICP type etching device, is preferably used. With such a high density of plasma and the resulting high ion flux of the incoming ions, a larger number of ions will charge up into a pattern in a floating state. This effectively decreases the ion flux, and therefore the etch selectivity. Meanwhile, the etch selectivity can be made larger for the pattern electrically conducting to the semiconductor substrate.

In this embodiment, it should be understood that a higher aspect ratio of the second connection hole 14, preferably more than 3, is desirable, since more fluorocarbon will adhere to the sidewall of second connection hole 14 as the aspect ratio increases, which will result in a further reduction in the selective ratio. In order to increase the aspect ratio of second connection hole 14, the thickness of interlayer insulating films 1c, 1d, and 1e may be increased. The sidewall of second connection hole 14 with a high aspect ratio encounters a relatively small ion flux, and incoming ions are more susceptible to entrance hindering effect (repulsive force) of the charged up floating pattern.

Figure 5:
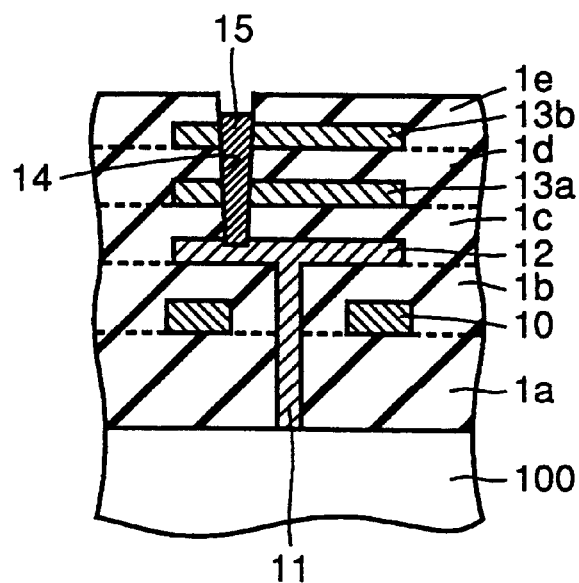

Next, referring to FIG. 5, a polycrystalline silicon film to be filled into second connection hole 14 is formed on semiconductor substrate 100, which is etched back to the upper end of third storage node electrode 13b by dry etching employing, for example, $Cl_2/He$ gas-plasma.

In this embodiment, the fin type storage node electrode in a DRAM is formed using the phenomenon that, in the same etching condition, the etch selectivity between an object to be etched and its underlayer varies dependent on whether or not the underlayer pattern is electrically conductive to a substrate. Therefore, while in a conventional method, the series of steps of forming an interlayer insulating film, performing photolithography, etching for forming a connection hole, forming a polycrystalline silicon film, performing photolithography, and etching for the formation of a storage node electrode had to be repeated for each fin, in the method according to the second embodiment of the present invention, the steps of photolithograhy and etching for forming a connection hole are performed only twice regardless of the number of fins. Accordingly, the number of process steps can substantially be reduced, and thus in manufacturing semiconductor devices, an improvement in the yield as well as a reduction in the manufacturing cost can be realized.

Assume that films including one having lower etch selectivity are to be etched. Conventionally, the etching condition should be altered during the process to control the etch selectivity. This is very difficult since the etching can stop accidentally depending on the timing error for switching the steps. According to the present invention, however, the etching condition need not be changed, so that a stable process can be achieved.

Third Embodiment

The third embodiment of the present invention is directed to a method of forming connection holes between a TFT electrode (a polycrystalline silicon film) and a semiconductor substrate, between an upper aluminum interconnection layer and a gate electrode (a W polycide film), and between the upper aluminum interconnection layer and the semiconductor substrate in SRAM.

Figure 6:
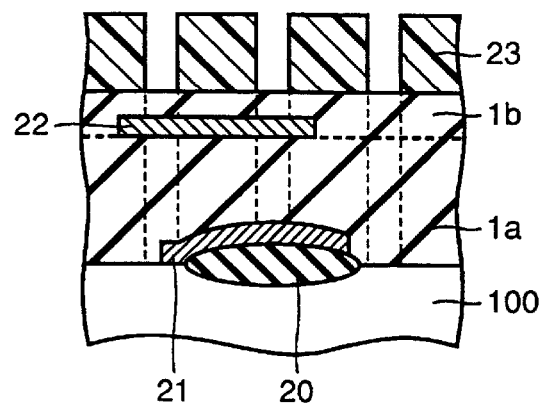
FIGS. 6, 7 and 8 are cross sectional views of a semiconductor device at first to third steps of the method of manufacturing a semiconductor device according to a third embodiment of the present invention.

Referring to FIG. 6, an element-isolating oxide film 20 is formed on the surface of a semiconductor substrate 100. On element-isolating oxide film 20, a gate electrode 21 is formed. An interlayer insulating film 1a is formed on semiconductor substrate 100 to cover gate electrode 21. Formed on interlayer insulating film 1a is a polycrystalline silicon film in a floating state, to form a TFT electrode 22. The polycrystalline silicon film is patterned by photolithography and dry etching employing, for example, $Cl_2/O_2$ gas-plasma, and thus TFT electrode 22 in a floating state is formed. A photoresist used as a mask in the photolithographic process is then removed. Thereafter, an interlayer insulating film 1b is formed on interlayer insulating film 1a to cover TFT electrode 22. Formed next on interlayer insulating film 1b by photolithography is a photoresist film 23 having an opening for the formation of a connection hole.

Figure 7:
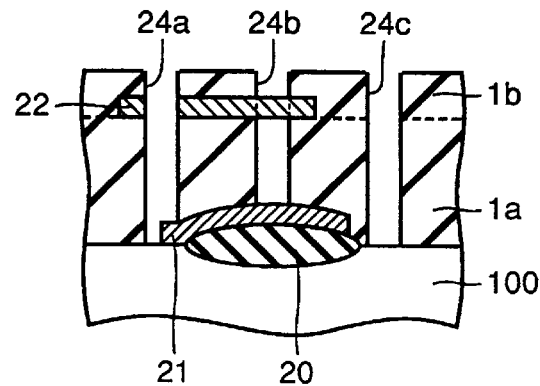

Referring to FIGS. 6 and 7, connection holes 24a, 24b, and 24c are formed in interlayer insulating films 1a and 1b, using photoresist pattern 23 as a mask and dry etching employing $C_4F_8/O_2$ gas-plasma. For the dry etching, a device which can generate plasma in a high density, such as an ECR type or ICP type etching device, is employed. Here, a higher aspect ratio is desirable for the pattern. In this embodiment, since the interlayer insulating film on TFT electrode 22 is at most 500 Å in thickness, the thickness of photoresist 23 was increased to obtain an aspect ratio more than 3. During dry etching, once the etching of connection hole 24a reaches TFT electrode 22 which is electrically isolated from the semiconductor substrate, positive ions generated in plasma gradually charge up into TFT electrode 22, and therefore in the TFT electrode, the repulsive force against the subsequently incoming ions increases. As a result, the ion flux decreases, and thus the etch selectivity between interlayer insulating film 1b and its underlayer, TFT electrode 22, is kept low, whereby connection hole 24a can easily penetrate TFT electrode 22.

When the etching of connection hole 24b reaches gate electrode 21, which is electrically isolated from the semiconductor substrate, gate electrode 21 is charged up with the incoming ions, and thus there arises a concern that the etch selectivity between interlayer insulating film 1a and its underlayer, gate electrode 21, may be lowered along with the reduction in ion flux. In this embodiment, a W polycide film is thus employed as the gate electrode. The W polycide film has a multi-layered structure with a W silicide film ($WSi_x$) and a polycrystalline silicon (polysilicon) film, and the connection hole 24b reaches the W silicide film. Generally, when dry etching employing $C_4F_8/O_2$ gas-plasma, the etch rate for a W silicide film is about ½ to ⅓ that for a polycrystalline silicon film. Therefore, the etching for the formation of connection hole 24b can be stopped on gate electrode 21. When the etching for connection hole 24c reaches semiconductor substrate 100, the incoming ions go out directly to semiconductor substrate 100. Accordingly, with no decrease in the ion flux, fluorocarbon is generated sufficiently enough to keep a high etch selectivity between interlayer insulating film 1a and semiconductor substrate 100.

Figure 8:
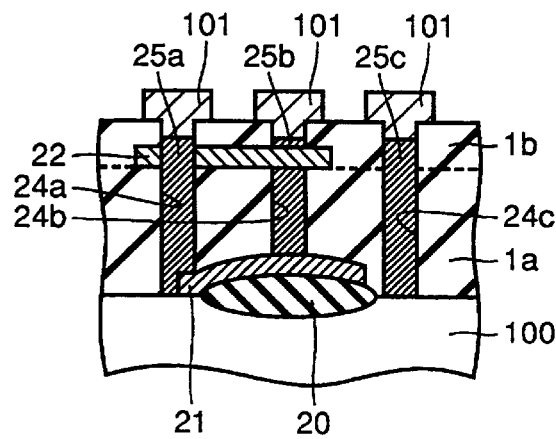
Figure 9:
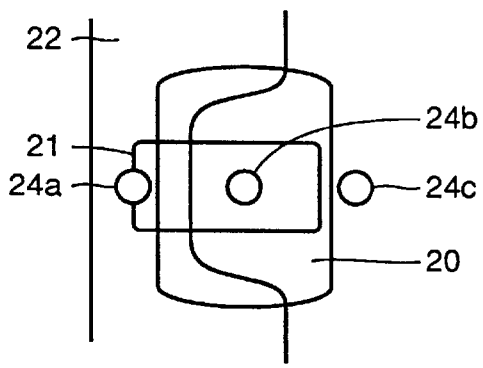
FIG. 9 is a top view of the semiconductor device shown in FIG. 8.

Lastly, a polycrystalline silicon film 25 for filling connection hole 24 is formed and etched back to the upper end of TFT electrode 22 by dry etching employing $Cl_2/He$ gas-plasma, for example. FIG. 9 is a top view of the semiconductor device obtained in FIG. 8.

As described above, when forming connection holes between TFT electrode 22 and semiconductor substrate 100, and between TFT electrode 22 and gate electrode 21, simultaneously with a single connection hole 24a, the etch selectivity between the interlayer insulating film and its underlayer varies dependent on whether or not the underlayer pattern is electrically conductive to the substrate, even in the same etching condition. The third embodiment takes advantage of this phenomenon.

Figure 17:
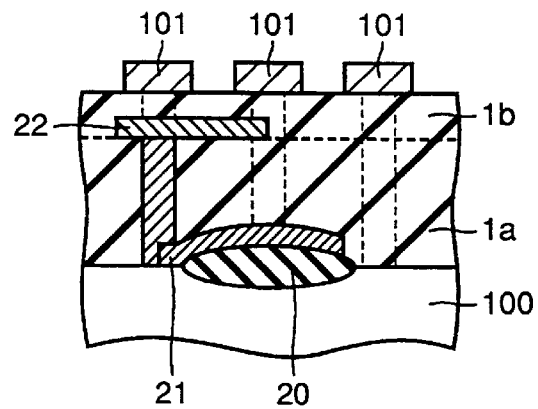
FIG. 17 is a cross sectional view of a third conventional semiconductor device.

Accordingly, as compared to the conventional method for forming a SRAM, as illustrated in FIG. 17, including the steps of forming a connection hole between a TFT electrode 22 and a semiconductor substrate 100; forming a polycrystalline silicon film for the formation of TFT electrode 22; performing photolithography; etching to form TFT electrode 22; forming an interlayer insulating film 1b; performing photolitography for the formation of connection holes between an aluminum interconnection layer 101 and a gate electrode 21 as well as between aluminum interconnection layer 101 and semiconductor substrate 100; and etching to form the connection holes between aluminum interconnection layer 101 and gate electrode 21 and between aluminum interconnection layer 101 and semiconductor substrate 100, in the method according to the third embodiment of the present invention, steps of photolithography and etching for forming a connection hole are needed only once, and thus the process steps can be substantially reduced. Therefore, the yield of the semiconductor device can be improved while the manufacturing cost can be reduced.

Furthermore, when films including one having lower etch selectivity are to be etched, it is required to change the etching conditions during the process in order to control their etch selectivity. This is difficult, since the etching may halt depending on the timing error for switching the steps. According to this embodiment, however, etching can be realized with a stable process, in which there is no need of changing the etching conditions.

Fourth Embodiment

The fourth embodiment is directed to a method of measuring the thickness of a thin gate oxide film.

Figure 10:
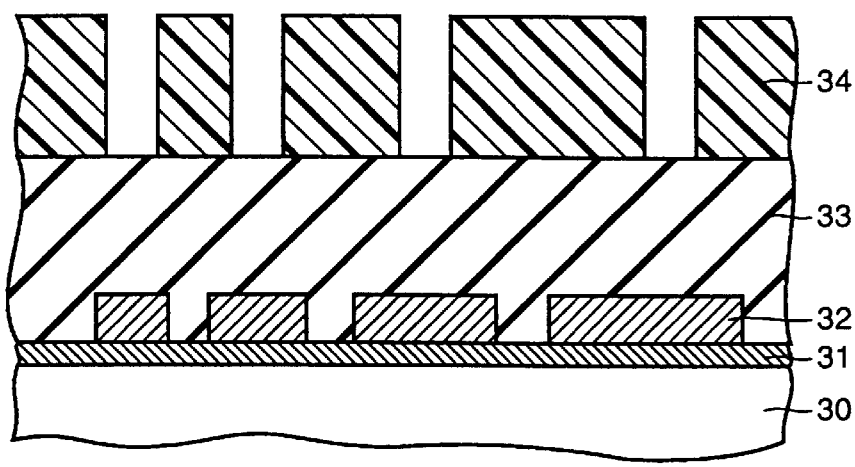
FIGS. 10 and 11 are cross sectional views of a semiconductor device at first and second steps of the method of measuring the thickness of a gate oxide film according to a fourth embodiment of the present invention.
Figure 11:
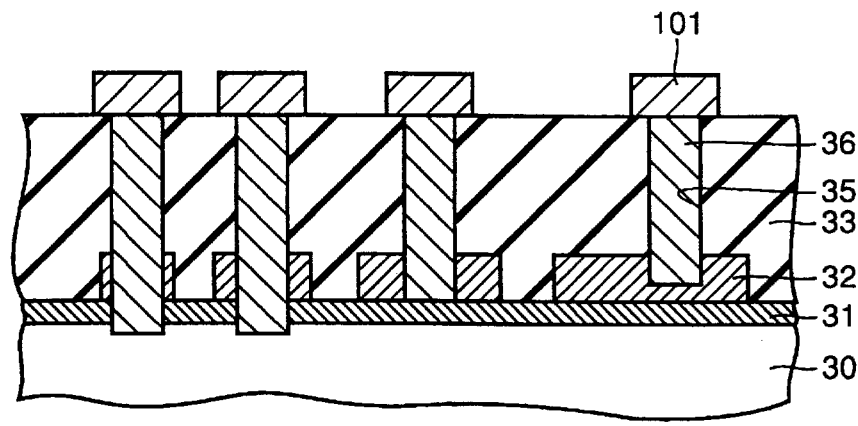

FIG. 10 is a cross sectional view of a monitor wafer used for measuring the thickness of a thin gate oxide film. Referring to FIG. 10, a thin gate oxide film 31, whose accurate thickness is not known, is formed on a substrate 30. A polysilicon film in a floating state is formed on gate oxide film 31, and patterned by photolithography and etching to form a plurality of polysilicon patterns 32 with different areas from one another, all in a floating state. Thereafter, an interlayer insulating film with an appropriate thickness, for example, a TEOS film 33 is formed on polysilicon patterns 32. Referring to FIGS. 10 and 11, a photoresist mask 34 is formed on interlayer insulating film 33, which mask has a plurality of openings for use in forming contact holes 35, each having an equal hole radius, to be connected to respective polysilicon patterns 32.

With reference to FIGS. 10 and 11, this wafer is etched for an appropriate time period, for example, by an ECR type etching device employing $C_4F_8/O_2$ gas. Photoresist mask 34 is then removed. Next, a W film is formed on the semiconductor substrate, and patterned to form a plug 36. An electrical conductivity between semiconductor substrate 30 and plug 36 is examined using the wafer formed on plug 36.

When the underlying polysilicon pattern 32 of the contact hole 35 is electrically in a floating state, the etch selectivity between the oxide film 33 and the polysilicon 32 varies according to the area of the underlying polysilicon pattern 32.

Figure 12:
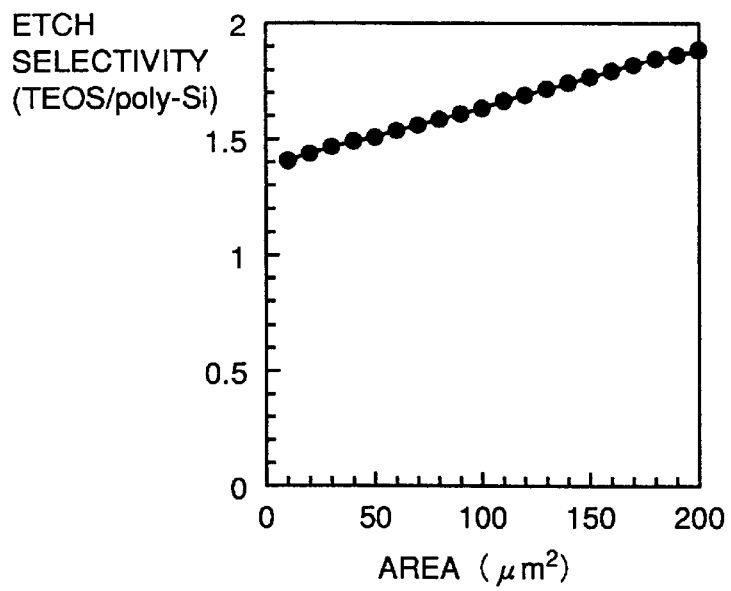
FIG. 12 is a graph showing a relation between the polysilicon pattern area and the etch selectivity (TEOS/polysilicon).
Figure 13:
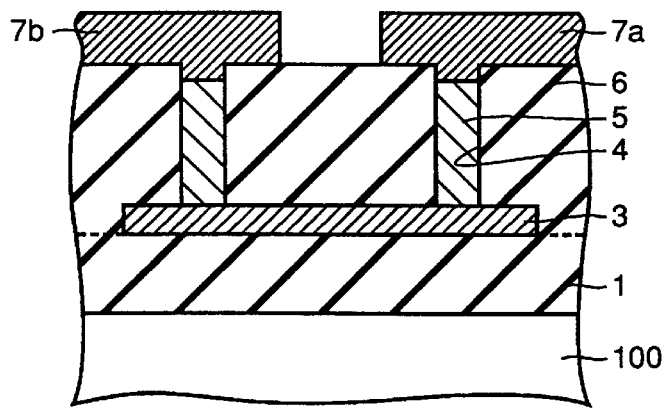
FIG. 13 is a cross sectional view of a first conventional semiconductor device.
Figure 14:
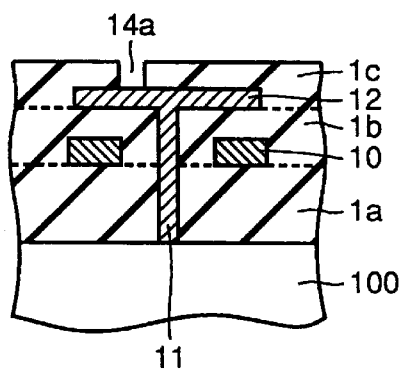
FIGS. 14, 15 and 16 are cross sectional views of a semiconductor device at first to third steps of the method of manufacturing a second conventional semiconductor device.
Figure 15:
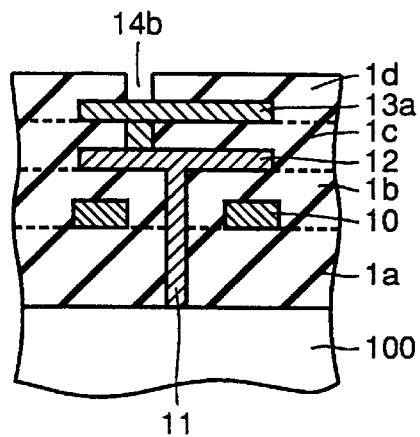
Figure 16:
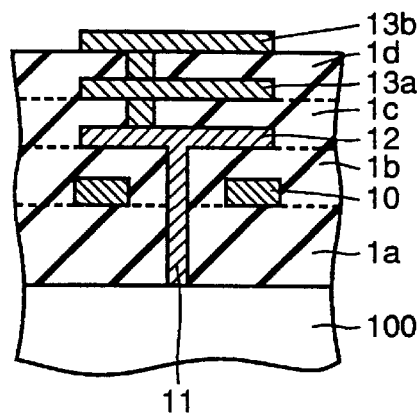

FIG. 12 is a graph showing a relation between the area of the underlying polysilicon which is electrically in a floating state and the etch selectivity between the oxide film and the polysilicon. This graph has been made separately.

Prior to calculating the thickness of the gate oxide film, the thicknesses of TEOS film 33 and polysilicon pattern 32 are measured with accuracy by an ellipsometer. The etch rates of TEOS film 33 and gate oxide film 31 when forming a hole with the same hole radius as contact hole 35 are also measured precisely in advance.

The etching time T is given by the following equation:

T=time required for etching TEOS film 33+time required for etching polysilicon pattern 32+time required for etching gate oxide film 31, where the time required for etching the gate oxide film is given by x (thickness of the film)/etch rate.

For example, when the thickness of TEOS film 33 is 340 nm, the thickness of polysilicon pattern 32 is 20 nm, the etch rate of TEOS film 33 when forming a hole with the same hole radius as contact hole 35 is 375 nm/min, the etch rate of the gate oxide film is 330 nm/min, the etching time (T) is 1 min, the area of the largest polysilicon pattern among those which ensure an electrical conduction to semiconductor substrate 30 is 100 $\mu m^2$, and the area of the smallest polysilicon pattern among those which are not conductive is 105 $\mu m^2$, the thickness of the gate oxide film 31 can be obtained as described below. Referring to FIG. 12, the etch rate of polysilicon with an area of 100 $\mu m^2$ is 230.7 nm/min, and the etch rate of the same with an area of 105 $\mu m^2$ is 229.0 nm/min. Accordingly, using the above equation, the thickness (x) of the gate oxide film 31 is found to be in the range from 1.98 nm to 2.19 nm.

It should be understood that, while the area of polysilicon pattern 32 has been described as incremented by the unit of 5 $\mu m^2$ in this embodiment, the thickness of the gate oxide film can be measured more precisely using smaller unit of increments.

As described above, according to the first aspect of the present invention for a method of manufacturing a semiconductor device, a conductive member is filled in a connection hole formed in an interconnection layer, so that a large contact area between the conductive member and the interconnection layer is ensured. Accordingly, the present invention is very effective when forming a contact hole whose sidewall area is made larger than the bottom area.

According to the second aspect of the present invention, etching is conducted by electron cyclotron resonance. Thus, the effects of the present invention manifest themselves more effectively.

According to the third aspect, the present invention is very effective when the contact hole is extremely small, even in which case a good electrical connection between the interconnection layer and the conductive member is ensured.

According to the fourth aspect of the present invention, a connection hole penetrating the second electrode and the interlayer insulating film and reaching the first electrode can be formed in a single step, and thus the manufacturing process is simplified. Accordingly, an improvement in the yield and a reduction in the manufacturing cost can be realized.

According to the fifth aspect of the present invention, a connection hole penetrating the second interlayer insulating film, the TFT electrode and the first interlayer insulating film and reaching the gate electrode can be formed in a single step, and therefore the manufacturing process is simplified. Consequently, the yield of the device can be improved while the manufacturing cost can be reduced.

According to the sixth aspect of the present invention, the thickness of an insulating film is obtained by simplify finding the first and the second polysilicon patterns. Therefore, the accurate thickness of an oxide film can be measured in a short time.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:
   forming on a semiconductor substrate an interconnection layer in a floating state with a stopper layer interposed therebetween to prevent dry etching;
   forming on said semiconductor substrate an interlayer insulating film to cover said interconnection layer;
   forming a connection hole by dry etching employing fluorocarbon to vertically penetrate through said interlayer insulating film and said interconnection layer, thereby exposing a surface of said stopper layer and further exposing a sidewall surface of a through hole formed in the interconnection layer; and
   filling in said connection hole with a conductive member to be electrically connected to said sidewall surface of said through hole in said interconnection layer.

2. The method of manufacturing a semiconductor device according to claim 1, wherein said dry etching is performed employing electron cyclotron resonance.

3. The method of manufacturing a semiconductor device according to claim 1, wherein sidewall area of said interconnection layer exposed by said connection hole is made larger than bottom area of said connection hole.

4. A method of manufacturing a semiconductor device having a fin type capacitor with a first electrode and a second electrode formed on the first electrode, comprising the steps of:
   forming on a semiconductor substrate said first electrode electrically conductive to the semiconductor substrate;
   forming on said semiconductor substrate an interlayer insulating film to cover said first electrode;
   forming on said interlayer insulating film said second electrode in a floating state;
   forming a connection hole penetrating said second electrode and said interlayer insulating film to reach said first electrode by dry etching using fluorocarbon; and
   filling a conductive member in said connection hole to electrically connect said first electrode and said second electrode.

5. A method of manufacturing a semiconductor device, comprising the steps of:
   forming on a semiconductor substrate an insulating film;
   forming on said insulating film a patterned polysilicon film comprising a plurality of patterns with different areas, all being in a floating state;
   forming on said semiconductor substrate an interlayer insulating film to cover said polysilicon films;
   forming on said interlayer insulating film a resist pattern having a plurality of openings for forming in said interlayer insulating film a plurality of connection holes to be reached to respective ones of said plurality of polysilicon films;
   dry etching with fluorocarbon for a prescribed period of time (T) using said resist pattern as a mask, thereby forming said plurality of connection holes penetrating said interlayer insulating film;
   filling said plurality of connection holes with a conductive member;
   determining the largest area of the patterned polysilicon film to establish electrical conduction between said semiconductor substrate and said conductive member, and determining the smallest area of the patterned polysilicon film which is not conductive; and
   calculating a range of film thickness (X) of said insulating film from the determined areas of said patterned polysilicon film, using the following equation:

$T=(a)+(b)+(c)$, wherein
   T represents said prescribed period of time for conducting said dry etching to form said connection hole,
   (a) is a time required for etching said interlayer insulating film, (b) is a time required for etching said first or second polysilicon pattern, and (c) is a time required for etching said insulating film, and wherein said (a) is calculated from a film thickness of said interlayer insulating film and an etch rate of the interlayer insulating film that is measured in advance, said (b) is calculated from a film thickness of said first or second polysilicon pattern and an etch rate of said first and second polysilicon pattern that is given from a separately prepared graph with its horizontal axis expressing an area of said polysilicon pattern and its vertical axis expressing an etch selectively (i.e., the etch rate of said interlayer insulating film/the etch rate of said polysilicon pattern), and said (c) is expressed in the following manner:

x (the film thickness of said insulating film)÷(an etch rate of said insulating film measured in advance).

* * * * *